(12) United States Patent
Uemura et al.

(10) Patent No.: US 10,420,238 B2
(45) Date of Patent: Sep. 17, 2019

(54) HOUSING KIT AND VENTILATION HOUSING

(71) Applicant: NITTO DENKO CORPORATION, Ibaraki-shi, Osaka (JP)

(72) Inventors: Kou Uemura, Osaka (JP); Youzou Yano, Osaka (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/315,552

(22) PCT Filed: Feb. 25, 2015

(86) PCT No.: PCT/JP2015/000968
§ 371 (c)(1),
(2) Date: Dec. 1, 2016

(87) PCT Pub. No.: WO2015/186279
PCT Pub. Date: Dec. 10, 2015

(65) Prior Publication Data
US 2017/0156228 A1 Jun. 1, 2017

(30) Foreign Application Priority Data
Jun. 2, 2014 (JP) .................. 2014-113823

(51) Int. Cl.
*F16J 15/10* (2006.01)
*H05K 5/06* (2006.01)
(Continued)

(52) U.S. Cl.
CPC ............ *H05K 5/061* (2013.01); *F16J 15/062* (2013.01); *F16J 15/102* (2013.01); *F21S 45/30* (2018.01); *F21V 31/03* (2013.01); *H05K 5/0213* (2013.01)

(58) Field of Classification Search
CPC ........ B65D 81/263; H05K 5/04; H05K 5/061; F16J 15/102
(Continued)

(56) References Cited

U.S. PATENT DOCUMENTS 8,246,726 B2   8/2012 Yano
8,814,993 B2   8/2014 Yano
(Continued)

FOREIGN PATENT DOCUMENTS

CN        1525381 A      9/2004
CN      200969925 Y     11/2007
(Continued)

OTHER PUBLICATIONS

Uemura, Ko, JP2011052791 Translation.pdf, "Ventilation structure and ventilation member", Mar. 2011, pp. 1-16.*
(Continued)

*Primary Examiner* — Vivek K Shirsat
*Assistant Examiner* — Ryan L Faulkner
(74) *Attorney, Agent, or Firm* — Sughrue Mion, PLLC

(57) ABSTRACT

A housing kit (90) includes a housing body (20) and a ventilation member (10). The housing body (20) has a vent hole (21). The ventilation member (10) has a leg portion (26). The leg portion (26) is a portion adapted to be inserted into the vent hole (21). The housing body (20) has an inner peripheral surface (23) that defines the vent hole (21). The inner peripheral surface (23) includes a first rounded segment ($23_{R1}$), a first straight segment ($23_{S1}$), a second rounded segment ($23_{R2}$), and a second straight segment ($23_{S2}$) that are formed in order from an exterior space (24) side to an interior space (22) side of the housing body (20). The first rounded segment ($23_{R1}$) and the second rounded segment ($23_{R2}$) each form a curve convex toward a central axis (O) of the vent hole (21) in a cross section of the
(Continued)

housing body (20) including the central axis (O). The first straight segment ($23_{S1}$) and the second straight segment ($23_{S2}$) each form a straight line in this cross section.

14 Claims, 8 Drawing Sheets

(51) Int. Cl.
  *F21V 31/03* (2006.01)
  *F16J 15/06* (2006.01)
  *H05K 5/02* (2006.01)
  *F21S 45/30* (2018.01)

(58) Field of Classification Search
  USPC ................................................ 454/184, 370
  See application file for complete search history.

(56) References Cited

U.S. PATENT DOCUMENTS

2011/0211311 A1* 9/2011 Shinoda ............... H05K 5/0047
  361/694

2013/0012117 A1 1/2013 Uemura et al.
2013/0055898 A1* 3/2013 Yano ..................... F21S 48/332
  96/4

FOREIGN PATENT DOCUMENTS

| CN | 102548282 A | 7/2012 |
| CN | 102834661 A | 12/2012 |
| EP | 1 903 843 A2 | 3/2008 |
| JP | 2003-287150 A | 10/2003 |
| JP | 2009-252508 A | 10/2009 |
| JP | 2011-52791 A | 3/2011 |
| JP | 2012-243536 A | 12/2012 |

OTHER PUBLICATIONS

Extended European Search Report dated Dec. 21, 2017, issued by European Patent Office in corresponding European application No. 15803448.8.
International Search Report of PCT/JP2015/000968 dated Apr. 7, 2015 [PCT/ISA/210].

* cited by examiner

FIG. 7A
(A)
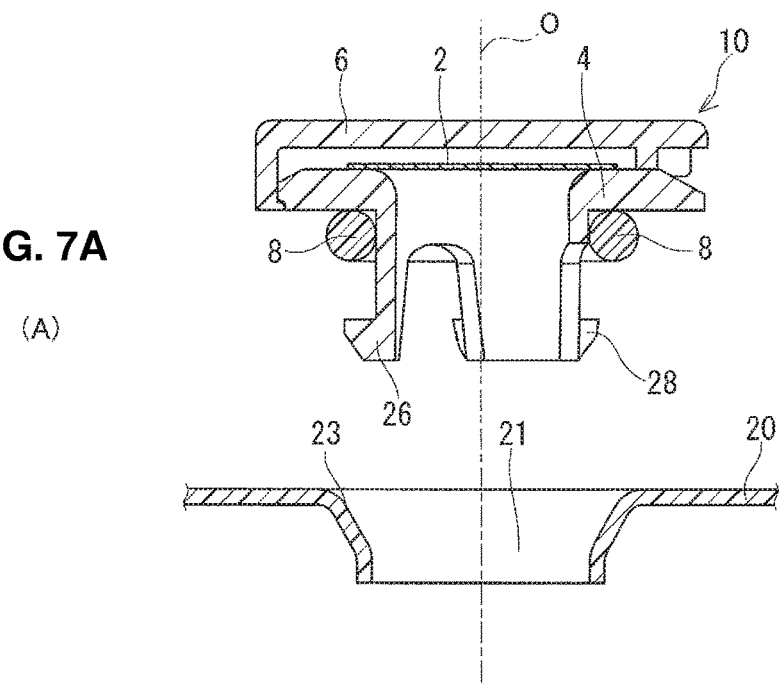
FIG. 7B
(B)
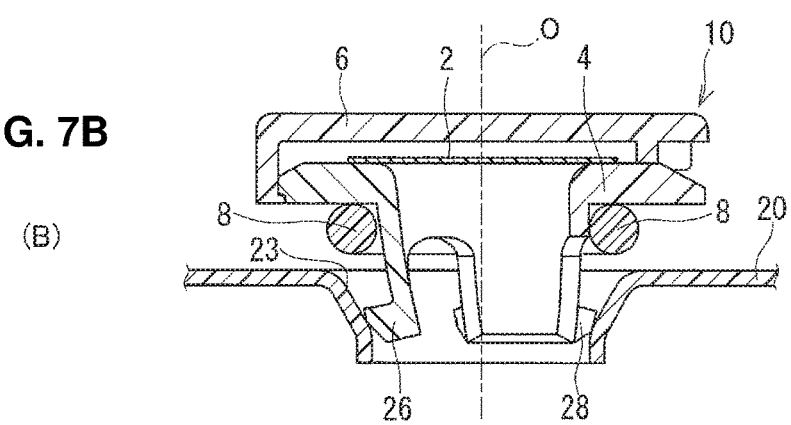
FIG. 7C
(C)
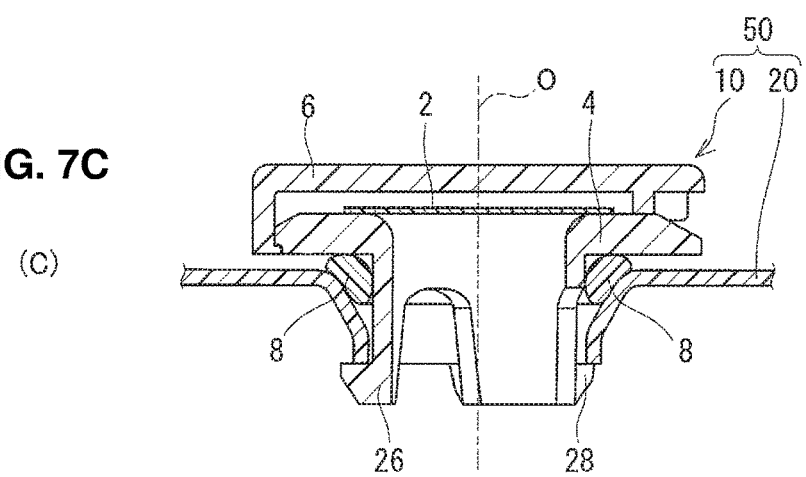
FIG.7

FIG. 12A
(A)
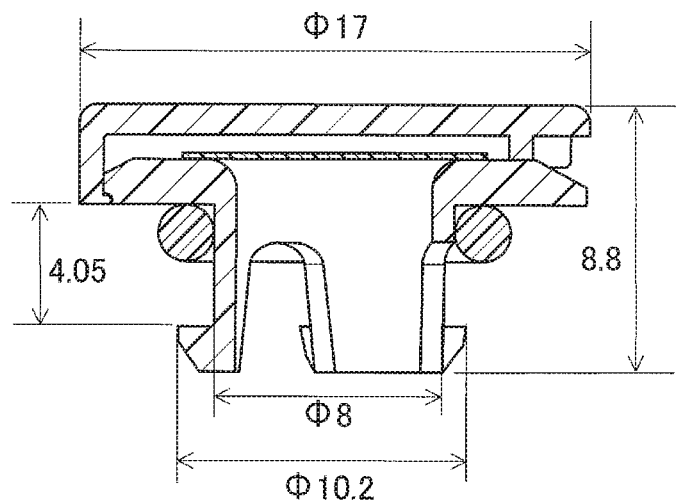
FIG. 12B
(B)
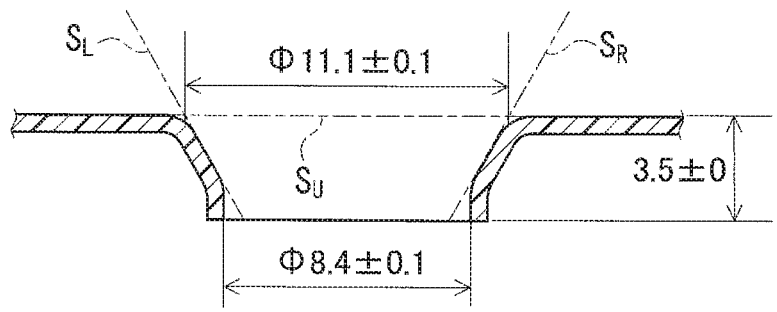
FIG.12

HOUSING KIT AND VENTILATION HOUSING

CROSS REFERENCE TO RELATED APPLICATIONS

This application is a National Stage of International Application No. PCT/JP2015/000968 filed Feb. 25, 2015, claiming priority based on Japanese Patent Application No. 2014-113823, filed Jun. 2, 2014, the contents of all of which are incorporated herein by reference in their entirety.

TECHNICAL FIELD

The present invention relates to a housing kit and a ventilation housing.

BACKGROUND ART

Automotive electrical/electronic components such as lamps, motors, sensors, switches, and ECUs (electronic control units) are placed in housings. Such housings have a vent hole, and a ventilation member is attached to the vent hole to prevent foreign matters from entering the housing while allowing gases to flow into and out of the housing. For example, Patent Literature 1 describes a ventilation housing including a housing and a ventilation member attached to the housing.

CITATION LIST

Patent Literature

Patent Literature 1: JP 2011-52791A

SUMMARY OF INVENTION

Technical Problem

It is desirable that a ventilation housing can be easily assembled. The present invention has been made to achieve this object.

Solution to Problem

The present invention provides a housing kit for use in producing a ventilation housing having a ventilation function, the housing kit including:

a housing body having a vent hole; and a ventilation member having a leg portion adapted to be inserted into the vent hole, wherein the housing body has an inner peripheral surface that defines the vent hole, the inner peripheral surface including a first rounded segment, a first straight segment, a second rounded segment, and a second straight segment that are formed in order from an exterior space side to an interior space side of the housing body, the first rounded segment and the second rounded segment each form a curve convex toward a central axis of the vent hole in a cross section of the housing body including the central axis, and the first straight segment and the second straight segment each form a straight line in the cross section.

The present invention also provides a ventilation housing having a ventilation function, including:

a housing body having a vent hole; and a ventilation member having a leg portion fitted in the vent hole, wherein the housing body has an inner peripheral surface that defines the vent hole, the inner peripheral surface including a first rounded segment, a first straight segment, a second rounded segment, and a second straight segment that are formed in order from an exterior space side to an interior space side of the housing body, the first rounded segment and the second rounded segment each form a curve convex toward a central axis of the vent hole in a cross section of the housing body including the central axis, and the first straight segment and the second straight segment each form a straight line in the cross section.

Advantageous Effects of Invention

The inner peripheral surface of the housing body includes a first rounded segment, a first straight segment, a second rounded segment, and a second straight segment that are formed in the shapes described above. When the ventilation member is attached to the vent hole of the housing body, the leg portion of the ventilation member is pressed into the interior space of the housing body smoothly along the inner peripheral surface thus formed. Therefore, the housing kit of the present invention can be easily assembled.

BRIEF DESCRIPTION OF DRAWINGS

FIGS. 7A, 7B and 7C are diagrams illustrating how to attach the support to the housing body.
FIGS. 12A and 12B are diagrams illustrating a ventilation housing of an experimental example.

DESCRIPTION OF EMBODIMENTS

Embodiments of the present invention will hereinafter be described with reference to the accompanying drawings.

First Embodiment (Housing Kit)

Figure 1:
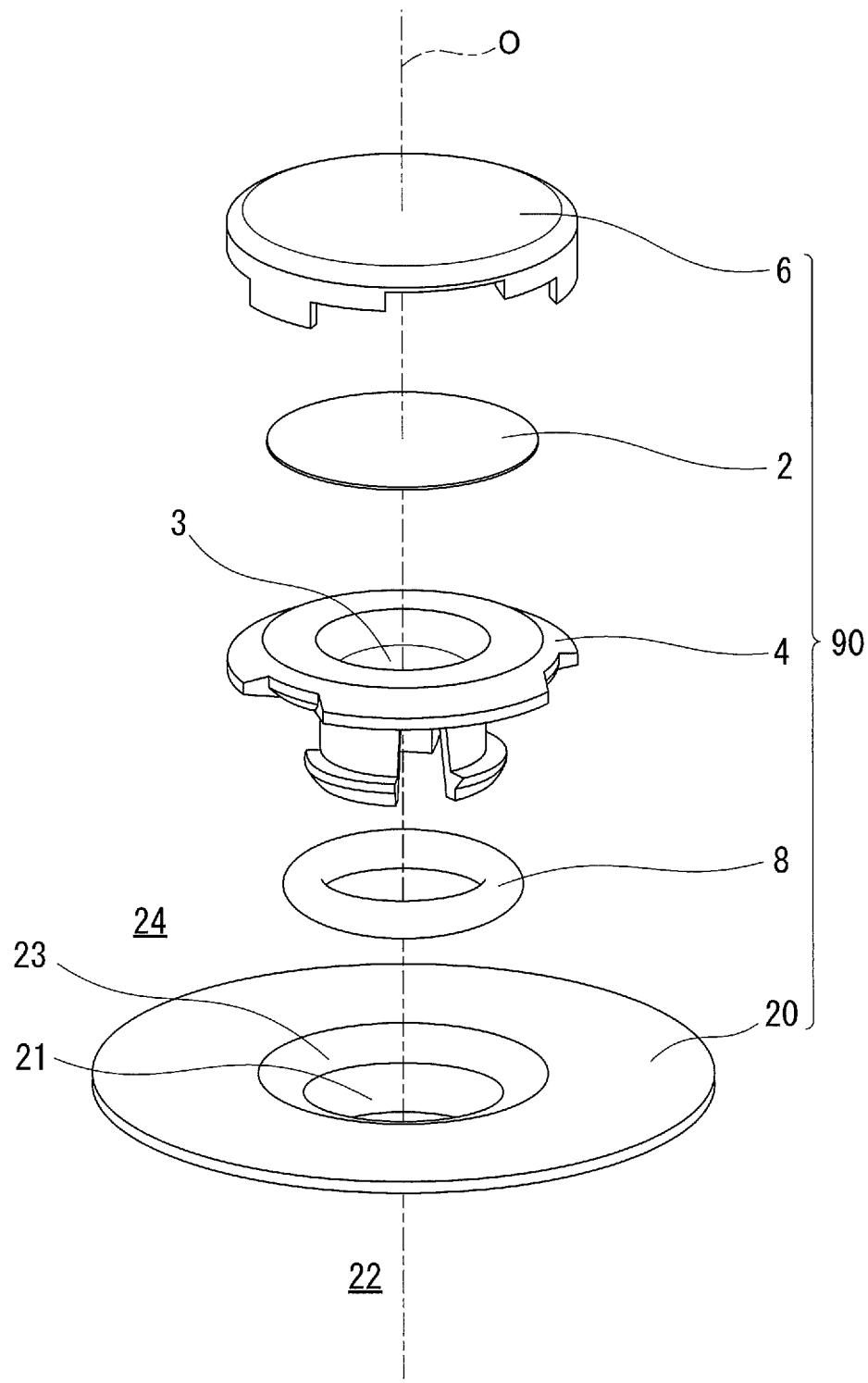
FIG. 1 is a perspective view of a housing kit.

FIG. 1 shows a housing kit 90 of a first embodiment. The housing kit 90 includes a housing body 20, a support 4, a cover 6, a gas-permeable membrane 2, and a seal ring 8.

Figure 2:
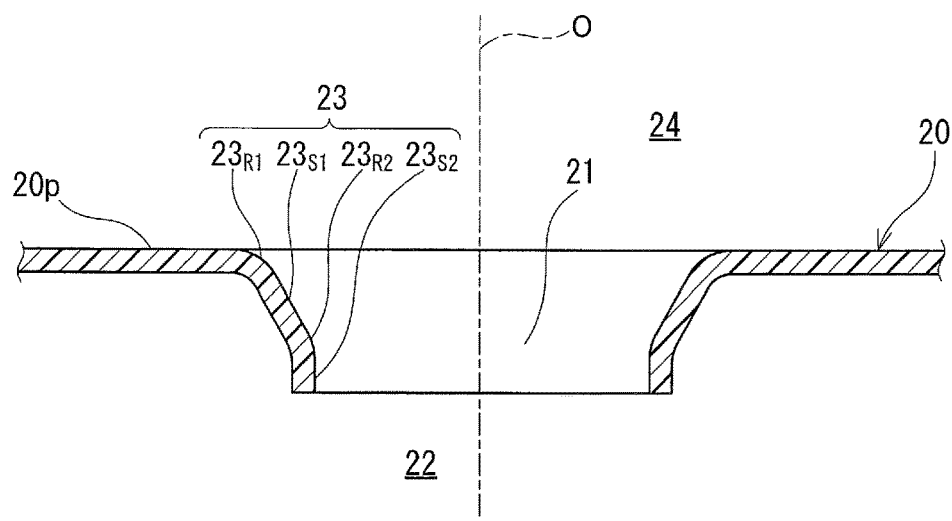
FIG. 2 is a cross-sectional view of a housing body.

FIG. 2 shows the housing body 20. The housing body 20 has an interior space 22 that requires ventilation and a vent hole 21 for ventilation. The housing body 20 is, for example, an ECU box or a lamp box for an automobile. It should be noted that FIG. 1 and FIG. 2 each show only a part of the housing body 20. The central axis O is an axis passing through the center of the vent hole 21. The vent hole 21 has a circular shape in plan view. Hereinafter, the term "axial direction" or "axially" may be used to indicate the direction in which the central axis O extends, and the term "radial direction" or "radially" may be used to indicate the direction perpendicular to the axial direction.

In the present embodiment, the housing body 20 is formed from a metal sheet. Examples of the metal sheet for the housing body 20 include an aluminum sheet, an iron sheet (for example, a cold-rolled steel sheet such as SPCC and SPCD), and a stainless steel sheet. A treated steel sheet such as an electro-galvanized steel sheet or a hot-dip galvanized steel sheet also can be used for the housing body 20. The thickness of the housing body 20 is about 0.5 to 2.5 mm. The housing body 20 is typically formed by sheet metal working (press working). In an example, first, a through hole is formed in a metal sheet by a metalworking technique such as punching. Next, the metal sheet is formed into a shape having an inner peripheral surface 23 (including a first rounded segment $23_{R1}$, a first straight segment $23_{S1}$, a second rounded segment $23_{R2}$, and a second straight segment $23_{S2}$) as shown in FIG. 2 by sheet metal working. Thus, the housing body 20 is obtained. The housing body 20 can also be obtained by die casting of a metallic material. The housing body 20 can further be obtained by molding (such as injection molding) of a resin material.

Figure 3:
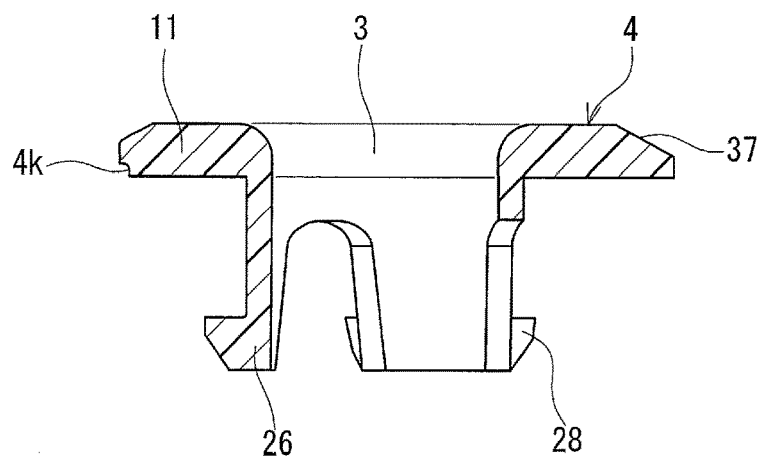
FIG. 3 is a cross-sectional view of a support.

FIG. 3 shows the support 4. The support 4 has a base portion 11 and a leg portion 26. The base portion 11 is a portion adapted to support the gas-permeable membrane 2. The leg portion 26 is a portion for securing the support 4 to the housing body 20.

The base portion 11 has an approximately disk shape. A through hole 3 is formed in the base portion 11. The through hole 3 is intended to serve as a gas passage communicating the interior space 22 and the exterior space 24 of the housing body 20. The base portion 11 includes a plurality of first engaging portions 4k for securing the cover 6 to the support 4. A slope 37 for drainage is formed on the outer peripheral portion of the base portion 11.

The leg portion 26 is formed integrally with the base portion 11 and extends downwardly from the base portion 11 (in the direction away from the base portion 11). The leg portion 26 is divided into a plurality of legs (3 legs in the present embodiment) along the circumferential direction of the through hole 3. The leg portion 26 has a plurality of hooks 28. The hooks 28 each has a shape protruding radially outwardly. The hooks 28 prevent detachment of the support 4 from the housing body 20 after a ventilation housing 50 shown in FIG. 7(C) is assembled. Specifically, the hooks 28 are portions adapted to be engaged with the housing body 20 from the interior space 22 side when the ventilation housing 50 is assembled. In the present embodiment, the legs of the leg portion 26 each includes the hook 28.

Figure 4:
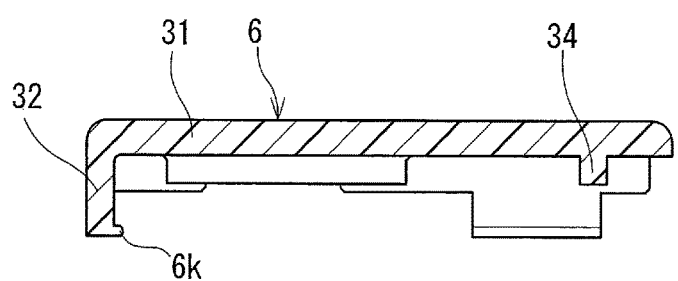
FIG. 4 is a cross-sectional view of a cover.

FIG. 4 shows the cover 6. The cover 6 is attached to the support 4 to cover the gas-permeable membrane 2. The cover 6 includes a ceiling portion 31, an outer peripheral wall 32, and a barrier wall portion 34. The ceiling portion 31 has, in plan view, a circular shape with a diameter large enough to cover the entire gas-permeable membrane 2. The outer peripheral wall 32 and the barrier wall portion 34 extend downwardly from the lower surface of the ceiling portion 31 (in the direction away from the ceiling portion 31). The outer peripheral wall 32 and the barrier wall portion 34 each have a circular arc shape in plan view.

The cover 6 includes a plurality of second engaging portions 6k. The second engaging portions 6k are adapted to be engaged with the first engaging portions 4k of the support 4. The second engaging portions 6k are provided to protrude radially inwardly from the outer peripheral wall 32.

The support 4 and the cover 6 can be produced by a common molding or forming technique such as injection molding, compression molding, or cutting. A thermoplastic resin such as PBT (polybutylene terephthalate), PA (polyamide), or PET (polyethylene terephthalate) can be suitably used as the material for the support 4 and the cover 6. The material for the support 4 and the cover 6 may contain a pigment, a filler, a water repellent material, etc. The surface of the support 4 and the surface of the cover 6 may have been subjected to water-repellent treatment to facilitate drainage of liquids from the surfaces.

Figure 5:
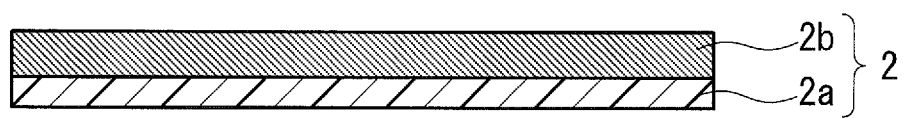
FIG. 5 is a cross-sectional view of a gas-permeable membrane.

FIG. 5 shows the gas-permeable membrane 2. The gas-permeable membrane 2 is disposed on the upper surface of the base portion 11 so as to cover the through hole 3. The structure and material of the gas-permeable membrane 2 are not particularly limited as long as the membrane 2 has the properties of allowing passage of gases and preventing passage of liquids. The gas-permeable membrane 2 may include a membrane body 2a and a reinforcing member 2b laminated on the membrane body 2a. The presence of the reinforcing member 2b increases the strength of the gas-permeable membrane 2. It should be understood that the gas-permeable membrane 2 may consist only of the membrane body 2a.

The membrane body 2a may have been subjected to liquid-repellent treatment such as oil-repellent treatment or water-repellent treatment. This liquid-repellent treatment can be performed by applying a material having a low surface tension to the membrane body 2a, followed by drying and then curing. Any liquid-repellent agent can be used for the liquid-repellent treatment as long as the agent can form a coating film having a lower surface tension than that of the membrane body 2a. For example, a liquid-repellent agent containing a polymer having a perfluoroalkyl group can be suitably used. The liquid-repellent agent is applied to the membrane body 2a by a known technique such as impregnation or spraying.

A typical example of the membrane body 2a is a porous membrane made of a fluororesin or a polyolefin. In order to ensure waterproofness, a porous resin membrane having an average pore diameter of 0.01 to 10 μm can be used as the membrane body 2a.

Examples of the fluororesin suitable for use as the membrane body 2a include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane body 2a include polymers and copolymers of monomers such as ethylene, propylene, 4-methylpentene-1,1 butene. A porous nanofiber film containing polyacrylonitrile, nylon, or polylactic acid also may be used. In particular, PTFE is preferably used because it has not only high gas permeability even with a small area but also high ability to prevent passage of foreign matters. Porous PTFE membranes can be produced by known forming techniques such as stretching and extraction.

The reinforcing member 2b may be a member made of a resin such as polyester, polyethylene, or aramid. The form of the reinforcing member 2b is not particularly limited as long as the gas permeability of the gas-permeable membrane 2 can be maintained. For example, the reinforcing member 2b is a woven fabric, a nonwoven fabric, a net, a mesh, a sponge, a foam, or a porous body. Preferably, the membrane body 2a and the reinforcing member 2b are laminated together by heat lamination, heat welding, or ultrasonic welding, or with an adhesive.

The thickness of the gas-permeable membrane 2 is preferably in the range of 1 µm to 5 mm in view of the strength and ease of handling. The gas permeability of the gas-permeable membrane 2 is preferably in the range of 0.1 to 100 cm$^3$/cm$^2$/sec in terms of the value measured using a Frazier permeability tester according to JIS (Japanese Industrial Standards) L 1096. The water entry pressure of the gas-permeable membrane 2 is preferably 1.0 kPa or more.

Figure 6:
FIG. 6 is a cross-sectional view of a seal ring.

FIG. 6 shows the seal ring 8. In the present embodiment, the seal ring 8 is made of a rubber-elastic material, for example, an elastomer such as nitrile rubber, ethylene-propylene rubber, silicone rubber, fluororubber, acrylic rubber, hydrogenated nitrile rubber, or the like. The seal ring 8 may be made of another rubber-elastic material such as a foam material, instead of an elastomer.

The ventilation housing 50 is obtained by assembling the housing kit 90 by the following procedure (FIGS. 7A, 7B and 7C). First, the gas-permeable membrane 2 is attached to the upper surface of the base portion 11 to cover the through hole 3. Next, the seal ring 8 is disposed around the base of the leg portion 26 of the support 4. Next, the cover 6 is attached to the support 4 to cover the gas-permeable membrane 2. Thus, the ventilation member 10 shown in FIG. 7A is obtained.

Next, the ventilation member 10 is attached to the housing body 20. Specifically, the leg portion 26 of the support 4 (i.e., the leg portion 26 of the ventilation member 10) is pressed into the vent hole 21 of the housing body 20 so as to fit the leg portion 26 in the vent hole 21. As shown in FIG. 7B, when the leg portion 26 is inserted into the vent hole 21, it is elastically deformed toward the central axis O and then fitted in the vent hole 21. Thus, the ventilation housing 50 is obtained (FIG. 7C).

As shown in FIG. 2, in the present embodiment, the housing body 20 has an inner peripheral surface 23 that defines the vent hole 21, and the inner peripheral surface 23 includes a first rounded segment $23_{R1}$, a first straight segment $23_{S1}$, a second rounded segment $23_{R2}$, and a second straight segment $23_{S2}$ that are formed in order from the exterior space 24 side to the interior space 22 side of the housing body 20. The first rounded segment $23_{R1}$ and the second rounded segment $23_{R2}$ each form a curve convex toward the central axis O of the vent hole 21 in a cross section of the housing body 20 including the central axis O. Specifically, in the present embodiment, the first rounded segment $23_{R1}$ and/or the second rounded segment $23_{R2}$ forms a circular arc in the cross section including the central axis O. In the cross section including the central axis O, the first straight segment $23_{S1}$ and the second straight segment $23_{S2}$ each form a straight line. In the present embodiment, the housing body 20 has a surface 20p extending radially outwardly from the edge of the inner peripheral surface 23 at a position away from the central axis O, and the surface 20p and the first rounded segment $23_{R1}$ are connected smoothly (without forming an angle between them). The first rounded segment $23_{R1}$ and the first straight segment $23_{S1}$ are also connected smoothly. The first straight segment $23_{S1}$ and the second rounded segment $23_{R2}$ are also connected smoothly. The second rounded segment $23_{R2}$ and the second straight segment $23_{S2}$ are also connected smoothly. In the present embodiment, the first rounded segment $23_{R1}$, the first straight segment $23_{S1}$, the second rounded segment $23_{R2}$, and the second straight segment $23_{S2}$ as described above form the inner peripheral surface 23. Thus, the support 4 can be smoothly inserted into the vent hole 21 of the housing body 20. The housing body 20 having the inner peripheral surface 23 as described above can easily be produced in quantity by sheet metal working.

In order to insert the support 4 smoothly into the vent hole 21, the inclination angle of the first straight segment $23_{S1}$ with respect to the central axis O can be, for example, 25 to 35° in the cross section including the central axis O. It should be noted that this inclination angle is an angle in the range of 0 to 90° with respect to the central axis O when the inclination angle of the first straight segment $23_{S1}$ parallel to the central axis O is defined as 0°.

In the present embodiment, in the cross section including the central axis O, the second straight segment $23_{S2}$ forms a straight line parallel to the central axis O. That is, the second straight segment $23_{S2}$ is a cylindrical surface. This configuration facilitates insertion of the support 4 into the vent hole 21. This is because the cylindrical surface stabilizes the radial position of the support 4 when inserted. Particularly in the present embodiment, the second straight segment $23_{S2}$ extends to the edge of the inner peripheral surface 23 on the interior space 22 side. This means that the edge of the inner peripheral surface 23 does not protrude radially inwardly. This configuration prevents excessive friction between the edge and the support 4 (hooks 28) when the support 4 is inserted into the vent hole 21.

The cross-sectional area of the vent hole 21 in the direction perpendicular to the central axis O (i.e., the radial direction) decreases from the exterior space 24 to the interior space 22. More specifically, the cross-sectional area of a portion of the vent hole 21 corresponding to the first rounded segment $23_{R1}$, the first straight segment $23_{S1}$, and the second rounded segment $23_{R2}$ monotonously decreases from the exterior space 24 to the interior space 22. The cross-sectional area of a portion of the vent hole 21 corresponding to the second straight segment $23_{S2}$ is constant.

In the present embodiment, the outer diameter of a portion of the support 4 provided with the hooks 28 decreases as the distance from the base portion 11 increases. This configuration also facilitates insertion of the support 4 into the vent hole 21.

Figure 8:
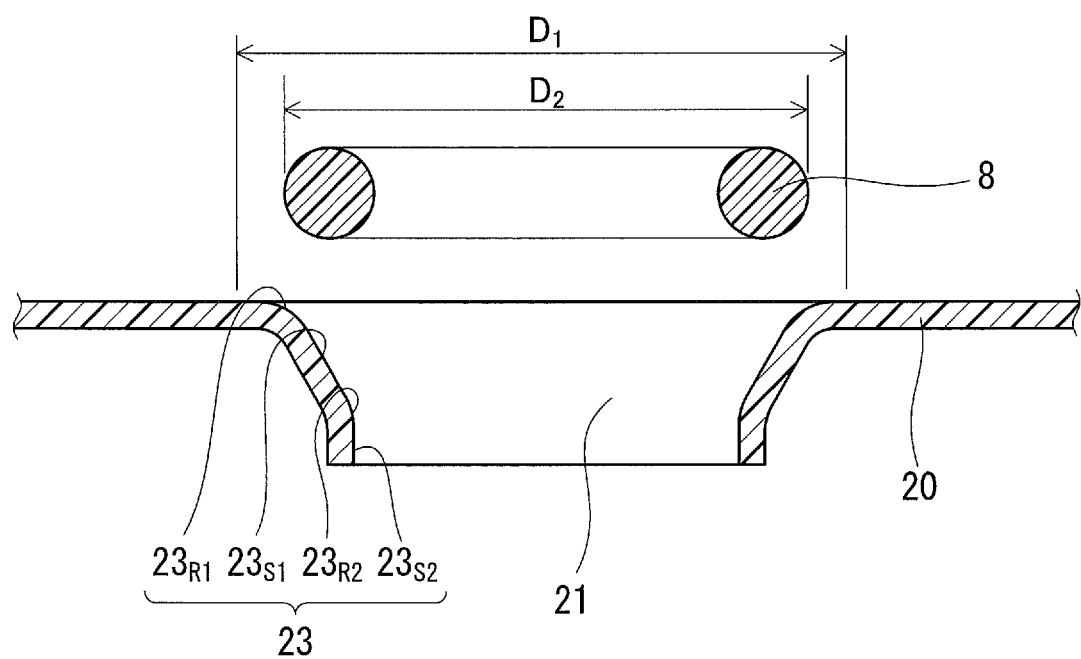
FIG. 8 is a cross-sectional view showing the outer diameters of the seal ring and a vent hole.

As shown in FIG. 8, in the present embodiment, the outer diameter $D_2$ of the seal ring 8 is smaller than the largest diameter $D_1$ (i.e., the diameter on the exterior space 24 side) of the vent hole 21, not only when the seal ring 8 is not elastically deformed in its initial state but also when it is elastically deformed after the ventilation member 10 is assembled. That is, the dimensions of the housing body 20, the support 4, and the seal ring 8 are determined and the material of the seal ring 8 is selected so that the diameters $D_1$ and $D_2$ meet the relative size condition mentioned above. Therefore, when the ventilation member 10 is attached to the housing body 20, the seal ring 8 is first placed in a position of the inner peripheral surface 23 that is inclined both radially and axially, and then guided along the inner peripheral surface 23 until it is settled in place.

(Ventilation Housing)

Figure 9:
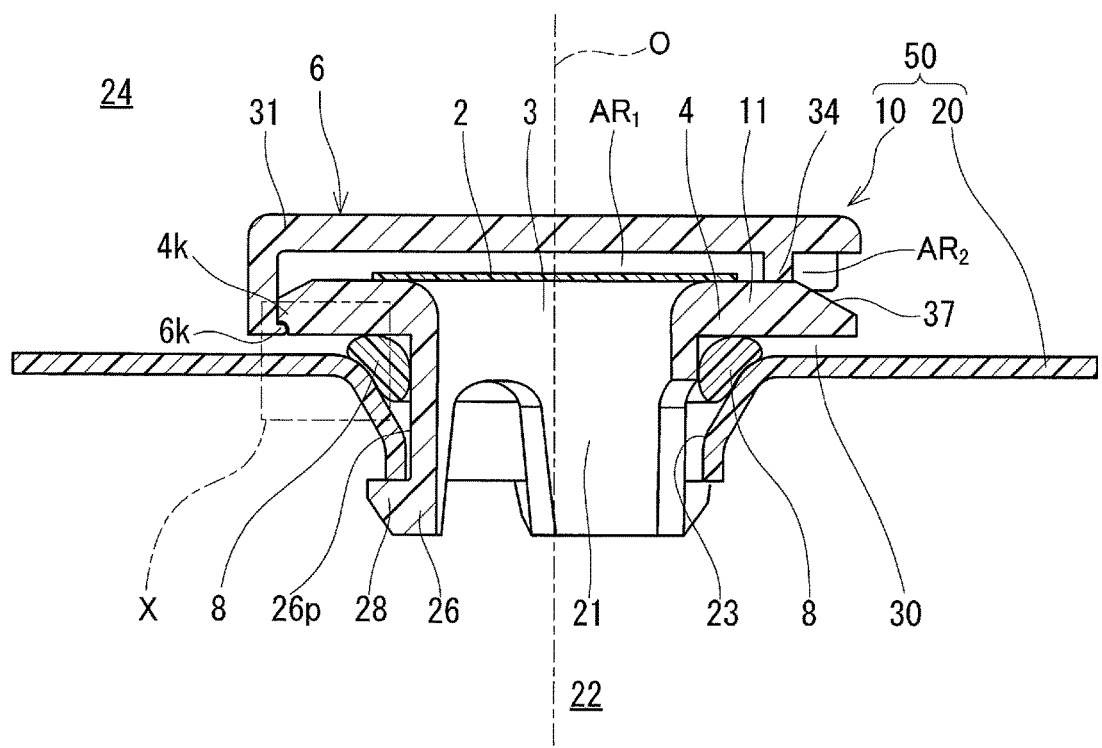
FIG. 9 is a cross-sectional view of a ventilation housing.

The ventilation housing 50 shown in FIG. 9 includes the housing body 20 and the ventilation member 10. The ventilation member 10 includes the support 4, the cover 6, the gas-permeable membrane 2, and the seal ring 8.

The support 4 is secured to the housing body 20. Specifically, the leg portion 26 of the support 4 (i.e., the leg portion 26 of the ventilation member 10) is fitted in the vent hole 21 of the housing body 20. The hooks 28 of the leg portion 26 are engaged with the housing body 20 from the interior space 22 side.

The gas-permeable membrane 2 is disposed on the base portion 11 to cover the through hole 3 from the exterior space 24 side.

The cover 6 is attached to the support 4 to cover the gas-permeable membrane 2. The second engaging portions 6k of the cover 6 are engaged with the first engaging portions 4k of the support 4. Thereby, the position of the cover 6 relative to the support 4 is fixed.

The central portion of the cover 6 forms a space $AR_1$ with the gas-permeable membrane 2. The outer peripheral portion of the cover 6 forms a space $AR_2$ with the outer peripheral portion of the support 4. The space $AR_1$ and the space $AR_2$ allow the interior space 22 and the exterior space 24 to communicate with each other. Gases are allowed to flow through the interior space 22, the through hole 3, the gas-permeable membrane 2, the space $AR_1$, the space $AR_2$, and the exterior space 24 in this order or in the reverse order. On the other hand, unlike the gases, foreign matters are trapped on the gas-permeable membrane 2.

The barrier wall portion 34 of the cover 6 prevents foreign matters (such as liquids and dust particles) from travelling radially inwardly in a straight line from the exterior space 24 toward the space $AR_1$. That is, the barrier wall portion 34 forms a labyrinth structure for preventing foreign matters from reaching the gas-permeable membrane 2. This configuration makes the gas-permeable membrane 2 less susceptible to damage. In the present embodiment, liquids hit against the barrier wall portion 34 and then are smoothly drained from the ventilation member 10 while flowing down along the slope 37 of the support 4.

The seal ring 8 is provided at the base of the leg portion of the support 4. In the vent hole 21, the seal ring 8 is disposed between the support 4 and the housing body 20. Specifically, the seal ring 8 is deformed along the inner peripheral surface 23 (so that the seal ring 8 is in contact with the first rounded segment $23_{R1}$ and the first straight segment 230. The sealing surface formed by the seal ring 8 is hidden inside the vent hole 21 and inclined with respect to the radial direction. This sealing surface is highly effective in sealing against radial water jets.

Figure 10:
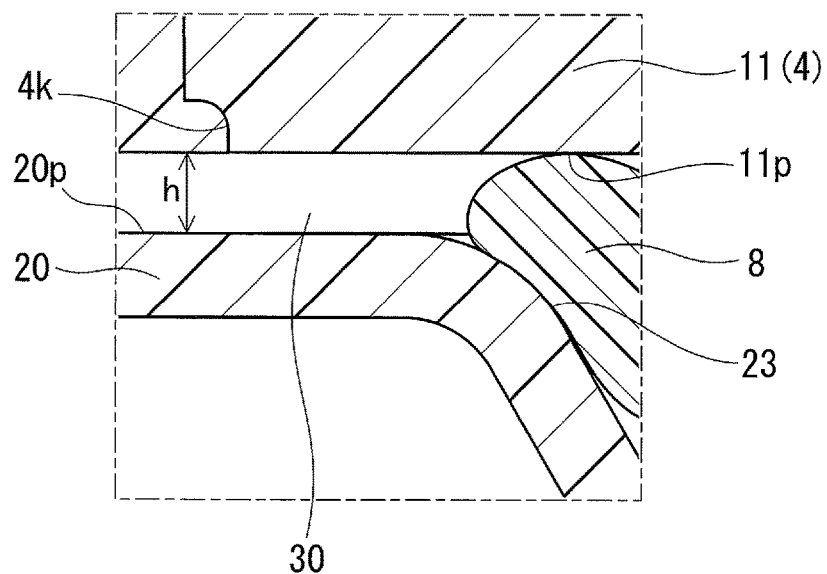
FIG. 10 is a partially enlarged cross-sectional view of the ventilation housing.

Liquids such as water and oil remaining attached to the seal ring 8 accelerate the deterioration of the seal ring 8. It may seem easy to avoid this by preventing the liquids from reaching the seal ring 8, but in practice it is not. A liquid having low surface tension (for example, a car lubricant) penetrates into even a narrow space by the capillary action. Therefore, it is difficult to completely prevent such a liquid from reaching the seal ring 8. Thus, in the present embodiment, a gap 30 is intentionally formed between the lower surface 11p of the base portion 11 of the support 4 and the surface 20p of the housing body 20 so as to expose a part of the seal ring 8 to that gap 30 (FIG. 10). This configuration allows liquids on the seal ring 8 to drain through the gap 30.

As described above in the housing kit section, the housing body 20 has an inner peripheral surface 23 that defines the vent hole 21, and the inner peripheral surface 23 includes the first rounded segment $23_{R1}$, the first straight segment $23_{S1}$, the second rounded segment $23_{R2}$, and the second straight segment $23_{S2}$, as shown in FIG. 2, that are formed in order from the exterior space 24 side to the interior space 22 side. Therefore, the inner peripheral surface 23 of the housing body 20 has high strength and thus is resistant to deformation. This effect is advantageous particularly when the housing body 20 is formed from a metal sheet (by sheet metal working) as in the present embodiment.

In the present embodiment, in the cross section including the central axis O, the second straight segment $23_{S2}$ forms a straight line parallel to the central axis O. The leg portion 26 of the support 4 are arranged to conform to the shape of the second straight segment $23_{S2}$. Therefore, even if an external impact is applied to the ventilation housing 50, the central axis O of the vent hole 21 is not displaced significantly from the central axis of the through hole 3 of the support 4.

Reference Embodiment

The ventilation housing 50 is designed to sufficiently prevent liquids from entering the interior space 22 through the gap 30 between the housing body 20 and the support 4. In light of this, in the reference embodiment, the ventilation housing 50 is defined as follows.

The ventilation housing 50 of the reference embodiment includes the housing body 20 and the ventilation member 10. The housing body 20 has the vent hole 21. The housing body 20 has the inner peripheral surface 23 that defines the vent hole 21, and the inner peripheral surface 23 includes the first rounded segment $23_{R1}$ and the first straight segment $23_{S1}$ that are formed in order from the exterior space 24 side to the interior space 22 side of the housing body 20. In the cross section of the housing body 20 including the central axis O of the vent hole 21, the first rounded segment $23_{R1}$ forms a circular arc (a rounded shape) that is convex toward the central axis O and has a radius of 0.5 to 3.0 mm (preferably 0.5 to 1.5 mm). In this cross section, the first straight segment $23_{S1}$ forms a straight line inclined at an angle of 25 to 35° (preferably 27 to 33° with respect to the central axis O. This inclination angle is an angle in the range of 0 to 90° with respect to the central axis O when the inclination angle of the first straight segment $23_{S1}$ parallel to the central axis O is defined as 0°. The ventilation member 10 includes the base portion 11 and the leg portion 26 that are formed integrally and the seal ring 8. The base portion 11 has an annular lower surface 11p. The lower surface 11p faces the surface (upper surface) 20p of the housing body 20. The leg portion 26 extends from the portion surrounded by the lower surface 11p of the base portion 11. The leg portion 26 is fitted in the vent hole 21. The seal ring 8 has a wire diameter of 1.8 to 2.0 mm and a hardness of 60 to 80 degrees when it is not elastically deformed in the initial state. The hardness is a type A hardness as measured according to JIS K 6253. The seal ring 8 forms the gap 30 when it is pressed into the vent hole 21 by the base portion 11 and brought into close contact with the base portion 11, the leg portion 26, and the inner peripheral surface 23. The gap 30 is formed between the surface (upper surface) 20p of the housing body 20 and the lower surface 11p of the base portion 11. The height h of the gap 30 in the axial direction is 0.01 to 1 mm (preferably 0.01 to 0.2 mm). The axial direction is a direction parallel to the central axis O.

In the ventilation housing 50 of the reference embodiment, the height h is in the above range. Therefore, high sealing against radial water jets is ensured while liquids on the seal ring 8 are allowed to drain.

Figure 11:
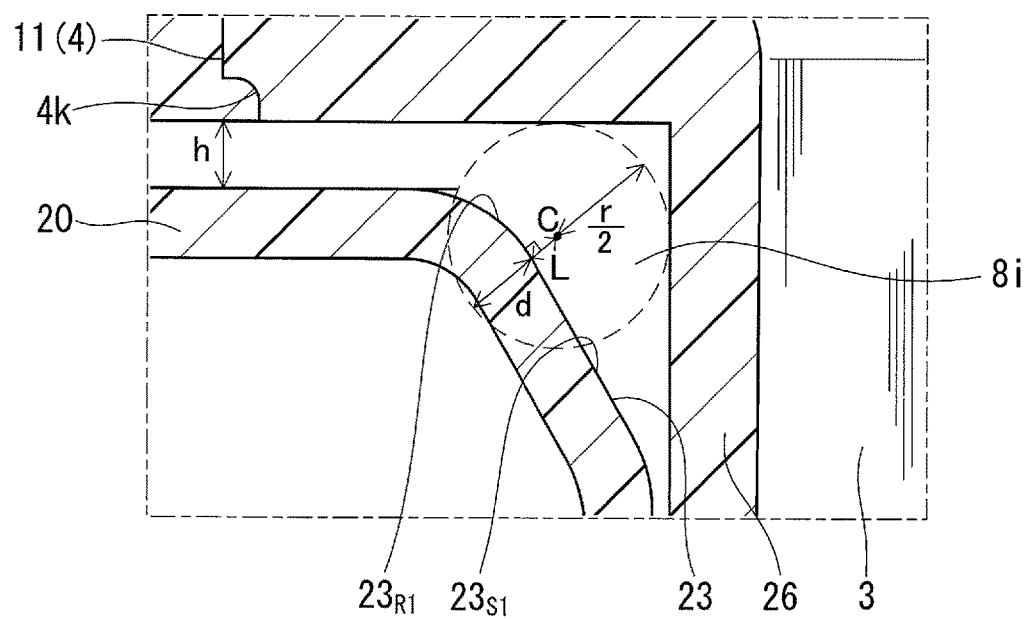
FIG. 11 is a diagram illustrating the compressed width and compression ratio of the sealing ring.

The seal ring 8 is elastically deformed. The "compression ratio of the seal ring 8" as a measure of the degree of elastic deformation of the seal ring 8 can be defined as follows. As shown in FIG. 11, in the cross section including the central axis O, an imaginary circle 8i having the same diameter r as the wire diameter of the elastically undeformed seal ring 8 in the initial state is drawn so as to make the circle tangent to the base portion 11 and the leg portion 26 in a region formed by the support 4 (the base portion 11 and the leg portion 26) and the housing body 20 (the inner peripheral surface 23). The difference $\{(r/2)-L\}$ between the radius r/2 of the imaginary circle 8i and the minimum distance L from the center C of the imaginary circle 8i to the inner peripheral surface 23 is defined as the actually compressed width d of the seal ring 8. In this case, the compression ratio of the seal ring 8 can be defined by 100×(compressed width d)/(wire diameter r of seal ring 8). The compression ratio of the seal ring 8 is preferably 8 to 42%.

In the ventilation housing 50 of the reference embodiment, the center of the imaginary circle 8i is axially displaced to a position close to the interior space 22 from the surface 20p. Therefore, as viewed radially inwardly, the most part of the seal ring 8 is hidden in the vent hole 21. With this configuration, stress applied to the seal ring 8 by radial water jets is limited. Thus, water leakage due to the displacement of the seal ring 8 is less likely to occur.

The techniques described in the reference embodiment can also be applied to the first embodiment. The techniques described in the first embodiment can also be applied to the reference embodiment.

Hereinafter, experimental examples of the ventilation housing 50 are described.

Experimental Example 1

As the ventilation member 10, a Z-PLUG manufactured by Nitto Denko Corporation was prepared. A seal ring in the Z-PLUG is a silicone O ring. The hardness of this seal ring is 70 degrees. The wire diameter of this seal ring is 1.90±0.05 mm. FIG. 12A shows the specific dimensions of the Z-PLUG. In FIG. 12A the numerical values are given in millimeters (mm) (the same applies in FIG. 12B).

A housing body having the same structure as the housing body 20 was formed from a metal sheet. In this housing body, the radius of the circular arc formed by the first rounded segment and the second rounded segment was 0.5 mm. The inclination angle of the first straight segment was 30±0.05° with respect to the central axis. The surface roughness Ra of the inner peripheral surface was 1.6 μm or less. FIG. 12B shows the specific dimensions of the housing body. In FIG. 12B, "Φ11.1±0.1" refers to the distance between two points of intersection, that is, a point of intersection between a straight line $S_L$ and a straight line $S_U$ and a point of intersection between a straight line $S_R$ and the straight line $S_U$. The two straight lines $S_L$ and $S_R$ each includes a line segment formed by the first straight segment in a cross section shown in FIG. 12B (i.e., a cross section including the central axis of the vent hole), and the straight line $S_U$ includes a line segment formed by the upper surface of the housing body in this cross section.

The Z-PLUG was fitted into the vent hole of the housing body thus formed. Thus, a ventilation housing having the same structure as the ventilation housing 50 was obtained. In this ventilation housing, the height of the gap (gap h) was 0.7 mm.

Experimental Example 2

A ventilation housing was obtained in the same manner as in Example 1 except that a housing body was formed so that the first rounded segment and the second rounded segment each formed a circular arc with a radius of 1.5 mm.

Experimental Example 3

A ventilation housing was obtained in the same manner as in Example 1 except that a housing body was formed so that the first rounded segment and the second rounded segment each formed a circular arc with a radius of 2.5 mm.

Experimental Example 4

A ventilation housing was obtained in the same manner as in Example 1 except that a housing body was formed so that the first rounded segment and the second rounded segment each formed a circular arc with a radius of 3.0 mm.

[Evaluation of Durability]

The ventilation housings prepared in the manner as described above were each subjected to a high-pressure car wash test according to "Deutsche Industrie Norm (DIN)" (German Industrial Standards) 40050 Tei19 IPX9. A high-pressure injection apparatus (S-204021) manufactured by Itabashi Rikakogyo Co., Ltd. was used for the test. Specifically, the test was conducted under three different sets of test conditions. Under the condition set 1, the water temperature was 80° C. The pressure of water injected from each nozzle was 9 MPa. The injection distance (i.e., the distance between each nozzle and the ventilation housing) was 14 cm. The rate of water injection from each nozzle was 16 L/min. Water was injected from the nozzles in four directions, i.e., a 0° direction (radially inward direction), a 30° direction, a 60° direction, and a 90° direction (axially downward direction). Water was injected for 30 seconds in each direction. During the injection, the ventilation housing was rotated at 5 rpm about the central axis of the vent hole. Under the condition set 2, the test was conducted in the same manner as under the condition set 1 except that the rate of water injection from the nozzle was changed to 18±1 L/min. Under the condition set 3, the test was conducted in the same manner as under the condition set 2 except that the pressure of water injected from the nozzle was changed to 11 MPa.

Table 1 shows the evaluation results. In Table 1, "A" indicates that no water penetration into the housing body was observed. "B" indicates that water penetration into the housing body was observed.

TABLE 1

|  | Condition set 1 | Condition set 2 | Condition set 3 |
|---|---|---|---|
| Experimental Example 1 (R = 0.5 mm) | A | A | A |
| Experimental Example 2 (R = 1.5 mm) | A | A | A |
| Experimental Example 3 (R = 2.5 mm) | A | B | B |
| Experimental Example 4 (R = 3.0 mm) | A | B | B |

INDUSTRIAL APPLICABILITY

The present invention can be applied to components such as lamps, motors, sensors, switches, ECUs, and gear boxes. The present invention can be applied not only to such automotive components but also to mobile communication devices, cameras, and electric appliances such as electric shavers and electric toothbrushes.

The invention claimed is:
1. A housing kit for use in producing a ventilation housing having a ventilation function, the housing kit comprising:
   a housing body having a vent hole; and
   a ventilation member having a seal ring and a leg portion, the leg portion being adapted to be inserted into the vent hole, wherein the housing body has an inner peripheral surface that defines the vent hole, the inner peripheral surface including a first rounded segment, a first straight segment, a second rounded segment, and a second straight segment that are formed in order from an exterior space side to an interior space side of the housing body, the first rounded segment and the second rounded segment each form a curve convex toward a central axis of the vent hole in a cross section of the housing body including the central axis, the first straight segment and the second straight segment each form a straight line in the cross section, when the ventilation housing is assembled, the seal ring is deformed along the inner peripheral surface in a state where the seal ring is in contact with the first rounded segment and the first straight segment, and in the cross section, the first rounded segment forms a first circular arc that is convex toward the central axis and has a radius of 0.5 to 3.0 mm, and an inclination angle of the first straight segment with respect to the central axis is 25° to 35°.

2. The housing kit according to claim 1, wherein in the cross section, the second rounded segment forms a second circular arc.

3. The housing kit according to claim 1, wherein in the cross section, the second straight segment forms a straight line parallel to the central axis.

4. The housing kit according to claim 1, wherein the housing body is formed by sheet metal working.

5. The housing kit according to claim 1, wherein the first circular arc has a radius of 0.5 to 1.5 mm.

6. The housing kit according to claim 1, wherein the seal ring has a wire diameter of 1.8 to 2.0 mm when the seal ring is not elastically deformed in an initial state.

7. The housing kit according to claim 6, wherein the ventilation member has a support, the support has the leg portion, and when the ventilation housing is assembled, a gap is formed between the housing body and the support, the gap having a height of 0.01 to 1 mm in a direction parallel to the central axis.

8. A ventilation housing having a ventilation function, comprising:

a housing body having a vent hole; and a ventilation member having a seal ring and a leg portion, the leg portion being fitted in the vent hole, wherein the housing body has an inner peripheral surface that defines the vent hole, the inner peripheral surface including a first rounded segment, a first straight segment, a second rounded segment, and a second straight segment that are formed in order from an exterior space side to an interior space side of the housing body, the first rounded segment and the second rounded segment each form a curve convex toward a central axis of the vent hole in a cross section of the housing body including the central axis, the first straight segment and the second straight segment each form a straight line in the cross section, the seal ring is deformed along the inner peripheral surface in a state where the seal ring is in contact with the first rounded segment and the first straight segment, in the cross section, the first rounded segment forms a first circular arc that is convex toward the central axis and has a radius of 0.5 to 3.0 mm, and an inclination angle of the first straight segment with respect to the central axis is 25° to 35°.

9. The ventilation housing according to claim 8, wherein in the cross section, the second rounded segment forms a second circular arc.

10. The ventilation housing according to claim 8, wherein in the cross section, the second straight segment forms a straight line parallel to the central axis.

11. The ventilation housing according to claim 8, wherein the housing body is formed by sheet metal working.

12. The ventilation housing according to claim 8, wherein and the first circular arc has a radius of 0.5 to 1.5 mm.

13. The ventilation housing according to claim 8, wherein the seal ring has a wire diameter of 1.8 to 2.0 mm when the seal ring is not elastically deformed in an initial state.

14. The ventilation housing according to claim 13, wherein the ventilation member has a support, the support has the leg portion, and a gap is formed between the housing body and the support, the gap having a height of 0.01 to 1 mm in a direction parallel to the central axis.

* * * * *